US009640471B2

(12) United States Patent
Kinzer

(10) Patent No.: US 9,640,471 B2
(45) Date of Patent: May 2, 2017

(54) LEADLESS ELECTRONIC PACKAGES FOR GAN DEVICES

(71) Applicant: NAVITAS SEMICONDUCTOR INC., El Segundo, CA (US)

(72) Inventor: Daniel M. Kinzer, El Segundo, CA (US)

(73) Assignee: NAVITAS SEMICONDUCTOR INC., El Segundo, CA (US)

( * ) Notice: Subject to any disclaimer, the term of this patent is extended or adjusted under 35 U.S.C. 154(b) by 0 days.

(21) Appl. No.: 15/050,338

(22) Filed: Feb. 22, 2016

(65) Prior Publication Data

US 2016/0247751 A1 Aug. 25, 2016

Related U.S. Application Data

(60) Provisional application No. 62/154,589, filed on Apr. 29, 2015, provisional application No. 62/120,177, filed on Feb. 24, 2015.

(51) Int. Cl.

| | |
|---|---|
| ***H01L 29/15*** | (2006.01) |
| ***H01L 23/495*** | (2006.01) |
| ***H01L 23/31*** | (2006.01) |
| ***H01L 23/00*** | (2006.01) |
| ***H01L 25/07*** | (2006.01) |
| ***H01L 25/16*** | (2006.01) |

(52) U.S. Cl.

CPC .... *H01L 23/49575* (2013.01); *H01L 23/3114* (2013.01); *H01L 23/49541* (2013.01); *H01L 23/49562* (2013.01); *H01L 23/49589* (2013.01); *H01L 24/49* (2013.01); *H01L 25/072* (2013.01); *H01L 25/16* (2013.01); *H01L 2224/05554* (2013.01); *H01L 2224/4814* (2013.01); *H01L 2224/48257* (2013.01); *H01L 2224/48465* (2013.01); *H01L 2924/00014* (2013.01); *H01L 2924/1033* (2013.01); *H01L 2924/1306* (2013.01); *H01L 2924/14* (2013.01); *H01L 2924/1426* (2013.01); *H01L 2924/181* (2013.01); *H01L 2924/19041* (2013.01); *H01L 2924/19105* (2013.01)

(58) Field of Classification Search

CPC ......... H01L 23/49575; H01L 23/49589; H01L 23/49541; H01L 23/49562

USPC .......................................................... 257/76

See application file for complete search history.

(56) References Cited

U.S. PATENT DOCUMENTS 7,250,672 B2 * 7/2007 Pavier .............. H01L 23/49562 257/676

OTHER PUBLICATIONS

"International Rectifier's iPOWIR™'s Full Function Power Stage Plus Control IC Reduces Space and Simplifies Design of High Efficiency POL Buck Converters," iPOWIR, printed from http://www.irf.com/pressroom/pressreleases/nr071219.html on Jan. 3, 2017.

* cited by examiner

*Primary Examiner* — Anthony Ho

(74) *Attorney, Agent, or Firm* — Kilpatrick Townsend and Stockton, LLP

(57) ABSTRACT

Leadless electronic packages for GaN-based half bridge power conversion circuits have low inductance internal and external connections, high thermal conductivity and a large separation between external connections for use in high voltage power conversion circuits. Some electronic packages employ "L" shaped power paths and internal low impedance die to die connections. Further embodiments employ an insulative substrate disposed within the electronic package for efficient power path routing and increased packaging density.

20 Claims, 11 Drawing Sheets

LEADLESS ELECTRONIC PACKAGES FOR GAN DEVICES

CROSS REFERENCE TO RELATED APPLICATIONS

This application claims priority to U.S. provisional patent application Ser. No. 62/154,589, for "LEADLESS HIGH SPEED HIGH VOLTAGE TRANSISTOR PACKAGE" filed on Apr. 29, 2015 and to U.S. provisional patent application Ser. No. 62/120,177, for "ELECTRONIC PACKAGES FOR GAN DEVICES" filed on Feb. 24, 2015 which are hereby incorporated by reference in their entirety for all purposes.

FIELD

The present invention relates generally to electronic packages for semiconductor devices and in particular to electronic packages for one or more GaN-based semiconductor devices.

BACKGROUND

Electronic devices such as computers, servers and televisions, among others, typically employ one or more power conversion circuits that convert one form of electrical energy to another. In some applications the power semiconductor devices utilized in the power conversion circuits may require specialized electronic packages to accommodate their unique physical configurations and performance requirements. For example, some power semiconductor devices are now capable of operating in the tens and hundreds of Megahertz which creates a need for low inductance electronic packages with high heat transfer capability for the high power density of the devices. Thus, new electronic packages that are suited for use with high frequency and high power density power semiconductors are needed.

SUMMARY

In some embodiments an integrated half-bridge component comprises a first semiconductor die mounted to a first die pad and includes a first power transistor having a first source terminal and a first drain terminal, wherein the first source terminal is electrically coupled to the first die pad and a second semiconductor die mounted to a second die pad and including a second power transistor having a second source terminal and a second drain terminal, and wherein the second source terminal is electrically coupled to the second die pad. An electrically insulative encapsulant is formed around the first and the second semiconductor dies. The component has an external ground connection formed by the first die pad, an external switch node connection formed by the second die pad and an external Vin connection that is coupled to a drain of the second semiconductor die.

In some embodiments the integrated half-bridge component further comprises a gap having a distance of at least 1.5 mm disposed between the first die pad and the second die pad. In one embodiment the first and the second semiconductor dies are GaN-based. In further embodiments the first semiconductor die has a top surface including the first source and the first drain terminal and a bottom surface that is attached to the first die pad.

In some embodiments the first drain terminal is electrically coupled to the second die pad. In one embodiment the integrated half-bridge component further comprises power connections disposed on a bottom surface of the component including a ground connection, a switch node connection and a Vin connection.

In some embodiments the power connections are arranged in an "L" shaped pattern with the ground connection forming a first leg, the switch node connection forming a corner and the Vin connection forming a second leg. In one embodiment the power connections are arranged in a linear pattern wherein the ground connection is followed by the switch node connection that is followed by the Vin connection. In further embodiments the first semiconductor die includes a first level shift circuit that is electrically coupled to a level shift receiver terminal on the second semiconductor die.

In some embodiments the level shift receiver terminal is coupled to a signal modulator that is coupled to a second power transistor drive circuit. In one embodiment the first level shift circuit is coupled to the gate drive terminal on the second semiconductor die using a die to die wirebond. In further embodiments the die to die wirebond is formed using a bond stitch on ball attachment.

In some embodiments an electronic power conversion component comprises an electrically conductive package base comprising a plurality of leads and first and second die pads and a first GaN-based die secured to the first die pad and including a first power transistor having a first source terminal and a first drain terminal, wherein the first source terminal is electrically coupled to the first die pad. The component also comprises a second GaN-based die secured to the second die pad and including a second power transistor having a second source terminal and a second drain terminal, wherein the second source terminal is electrically coupled to the second die pad. A plurality of wire bonds electrically couple the plurality of leads to the first and second GaN-based dies and an encapsulant is formed over the first and second GaN-based dies and at least a top surface of the package base.

In some embodiments the electronic power conversion component further comprises a third die including a control circuit electrically coupled to the first GaN-based die, and secured to the first die pad.

In some embodiments an electronic component comprises a first lead, a second lead and a third lead. A first GaN-based semiconductor die has a bottom surface mounted to the first lead and a top surface including a first power transistor having a first source terminal, a first drain terminal and a first input terminal, wherein the first source terminal is electrically coupled to the first lead, the first drain terminal is coupled to the second lead and the first input terminal is coupled to the third lead. In one embodiment a plurality of wirebonds electrically couple the first source terminal to the first lead. In some embodiments the electronic package has a fourth lead that is a kelvin connection to the first source terminal.

In some embodiment an electronic power conversion component comprises an electrically conductive package base comprising a plurality of leads and a die pad. A first GaN-based die is secured to the die pad and includes a first power transistor having a first source terminal and a first drain terminal, wherein the first source terminal is electrically coupled to the die pad. An insulative substrate is secured to the die pad and has an electrically conductive top surface. A second GaN-based die is secured to the electrically conductive top surface and includes a second power transistor having a second source terminal and a second drain terminal, wherein the second source terminal is electrically coupled to the electrically conductive top surface. A switch-node connection is formed within the electronic power conversion component between the first drain terminal and the electrically conductive top surface and an encapsulant is formed over the first and second GaN-based dies, the insulative substrate and at least a top surface of the package base.

In some embodiments the electronic power conversion component further comprises a third die secured to the die pad and includes control circuitry configured to control the operation of the first and the second power transistors. In one embodiment a bootstrap capacitor is disposed within the component and is attached to the electrically conductive top surface of the insulative substrate.

DETAILED DESCRIPTION

Figure 1:
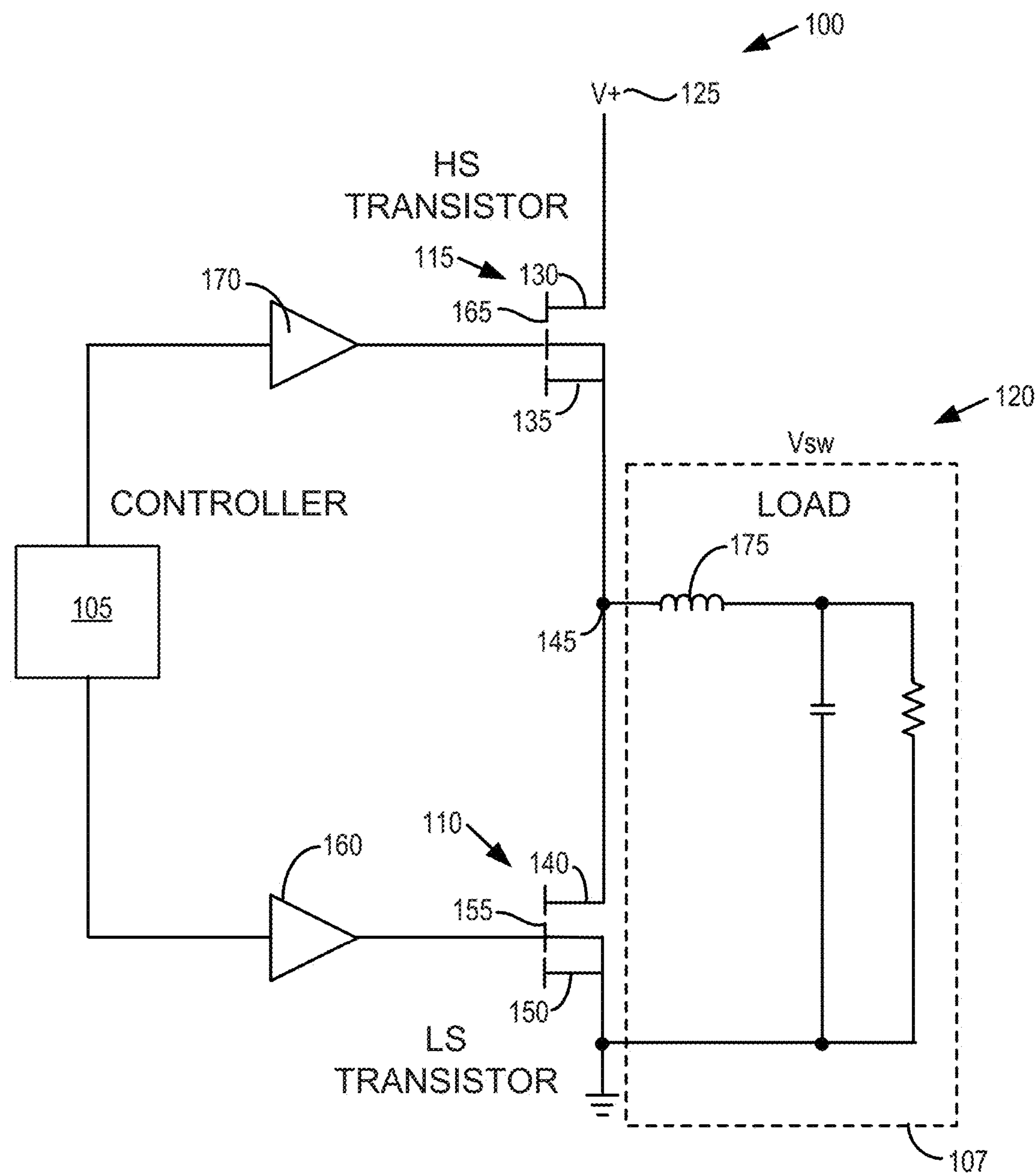
FIG. 1 is a simplified schematic of a half bridge power conversion circuit according to an embodiment of the invention.

Certain embodiments of the present invention relate to electronic packages for semiconductor devices. While the present invention can be useful for a wide variety electronic packages, some embodiments of the invention are particularly useful for electronic packages exhibiting low inductance, high thermal conduction and a large separation between pins for GaN-based semiconductors for use in power conversion circuits as described in more detail below.

For example, in some embodiments a GaN-based semiconductor device may be configured to operate at voltages greater than 200 Volts and have source and drain terminals on its top surface that are only approximately 1 millimeter apart. The GaN-based semiconductor device may be disposed within an electronic package having a dielectric encapsulant that may provide the necessary high voltage isolation between the source and drain terminals while specialized connection layouts may enable the external connections on the electronic package to be much greater than the 1 millimeter internal spacing so the electronic package can meet high voltage creepage and clearance requirements. In further embodiments two or more semiconductor devices that form a portion of a half bridge power conversion circuit may be copackaged within a unitary electronic package. The two or more semiconductor devices may each have sources coupled to their respective die attach pads with a plurality of relative short wirebonds and the two dies may be coupled together using low inductance and low parasitic capacitance interconnects to facilitate improved converter performance, as discussed in more detail below.

In order to better appreciate the features and aspects of electronic packages for GaN-based devices according to the present invention, further context for the invention is provided in the following section by discussing one particular implementation of electronic packaging for GaN-based semiconductor devices according to embodiments of the present invention. These embodiments are for example only and other embodiments may be employed for other devices such as multiple GaN-based devices in a single electronic package, a combination of GaN and Si devices in a single package or electronic packages that include other types of devices such as, but not limited to silicon, indium phosphide, gallium nitride or silicon carbide.

Further, certain embodiments of the present invention relate to half bridge power conversion circuits that employ one or more gallium nitride (GaN) devices. While the present invention can be useful for a wide variety of half bridge circuits, some embodiments of the invention are particularly useful for half bridge circuits designed to operate at high frequencies and/or high efficiencies with integrated driver circuits, integrated level shift circuits, integrated bootstrap capacitor charging circuits, integrated startup circuits and/or hybrid solutions using GaN and silicon devices, as described in more detail below. However, the embodiments herein are not limited to half bridge circuits or power conversion circuits and may be used in other applications.

Multi-Die Packages

Now referring to FIG. 1, an example half bridge power conversion circuit 100 that may employ one or more packaged GaN-based semiconductor devices is illustrated. Half bridge circuit 100 may also be known as a synchronous Buck converter and it may operate similar to known circuits of this configuration. Circuit 100 is used for example only and the electronic packages described herein may be used in other circuits without departing from the invention.

In some embodiments circuit 100 may include a pair of power transistors 110, 115 (also referred to herein as switches) that are controlled by one or more control circuits 105 configured to regulate power delivered to a load 120, as discussed in more detail below.

More specifically, integrated half bridge power conversion circuit 100 illustrated in FIG. 1 includes a low side GaN transistor 110 and a high side GaN transistor 115 coupled to the load 120. A voltage source 125 (also known as a rail voltage) may be connected to a drain 130 of high side transistor 115, and the high side transistor may be used to control power input into power conversion circuit 100. High side transistor 115 may further have a source 135 that is coupled to a drain 140 of low side transistor 110, forming a switch node 145. Low side transistor 110 may have a source 150 connected to ground. In one embodiment, low side transistor 110 may have a low side control gate 155 that is operated by a low side transistor driver 160 coupled to controller 105. Similarly, high side transistor 115 may have a high side control gate 165 that is operated by a high side transistor driver 170 coupled to controller 105.

The simplified operation of circuit 100 is described below, however other circuits may operate differently and this example shall in no way limit the invention. The operation of circuit 100 may be best understood in terms of the relation between current and voltage within inductor 175 in load 120. Beginning with high side transistor 115 open (off-state), the current in circuit 100 is zero. When high side transistor 115 is first closed (on-state), the current will begin to increase, and inductor 175 will produce an opposing voltage across its terminals in response to the changing current. This voltage drop counteracts the voltage of source 125 and therefore reduces the net voltage across load 120.

Over time, the rate of change of current decreases, and the voltage across inductor 175 also then decreases, increasing the voltage at load 120. During this time, inductor 175 stores energy in the form of a magnetic field. If high side transistor 115 is opened while the current is still changing, then there will be a voltage drop across inductor 175, so the net voltage at load 120 will be less than input voltage source 125. When high side transistor 115 is opened again (off-state), voltage source 125 will be removed from circuit 100, and the current will decrease. Very soon after high side transistor 115 is opened, low side transistor 110 is closed (on state) to allow the current to flow through inductor 175. In alternative configurations low side switch 110 may be replaced by a diode. The changing current will produce a change in voltage across inductor 175, now aiding source voltage 125. The stored energy in inductor's 175 magnetic field supports current flow through load 120. During this time, inductor 175 is discharging its stored energy into the rest of circuit 120. At some point before high side transistor 115 is closed, low side transistor 155 is opened. If high side transistor 115 is closed again before inductor 175 fully discharges (on-state), the voltage at load 120 will always be greater than zero.

Figure 2A:
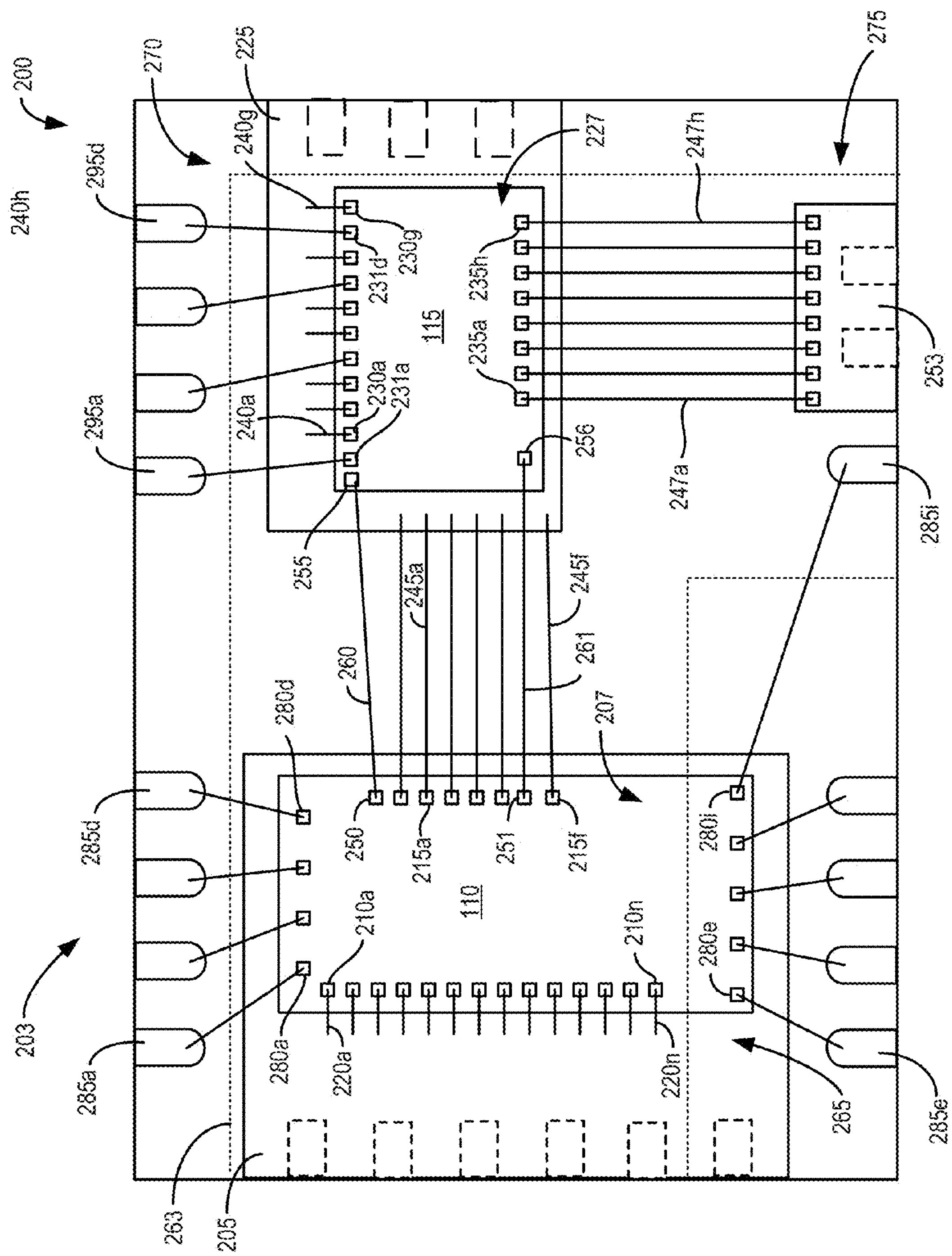
FIG. 2A is a plan view of the inside of a half-bridge component with the encapsulant removed according to an embodiment of the invention.

Now referring to FIG. 2A, a plan view of the interior of an embodiment of an electronic package 200 (i.e., the package encapsulant is removed) that contains low side transistor 110 and high side transistor 115 from circuit 100 illustrated in FIG. 1. Although the terms low side transistor and high side transistor are used herein, it is understood that in any embodiments described within this disclosure that the low side transistor and the high side transistor may include other integrated circuits such as low and high side drivers as well as other circuits. In some embodiments electronic package 200 may be fabricated using a quad-flat no lead (QFN) manufacturing process where low side and high side transistors, 110, 115, respectively are attached to a package base 203 comprising a metal leadframe, as described in more detail below. However, other embodiments may use different fabrication processes and package configurations. For example, in one embodiment package base 203 may be made from a multilayer printed circuit board.

In some embodiments a bottom surface (not shown in FIG. 2A) of low side transistor 110 is mounted to a first die pad 205 comprising a portion of package base 203 such that the low side transistor may efficiently couple thermal energy through the first die pad and out of electronic package 200. A top surface 207 of low side transistor 110 includes a plurality of first source terminals 210*a* . . . 210*n* and a plurality of first drain terminals 215*a* . . . 215*f* that may be separated by a distance of 1 millimeter or less. Plurality of first source terminals 210*a* . . . 210*n* are electrically coupled to first die pad 205 with a plurality of first source wirebonds 220*a* . . . 220*n* such that the first die pad forms an external ground connection, as illustrated in greater detail below. This configuration may enable relatively short first source wirebonds 220*a* . . . 220*n* such that an electrical connection from first die pad 205 to plurality of first source terminals 210*a* . . . 210*n* may exhibit low inductance, low parasitic capacitance and low loss characteristics.

A bottom surface (not shown in FIG. 2A) of high side transistor 115 is mounted to a second die pad 225 comprising a portion of package base 203 such that the high side transistor may efficiently couple thermal energy through the second die pad and out of electronic package 200. A top surface 227 of high side transistor 115 includes a plurality of second source terminals 230*a* . . . 230*g* interleaved with a plurality of signal I/O terminals 231*a* . . . 231*d*, and a plurality of second drain terminals 235*a* . . . 235*h* that may be separated from the source/signal terminals by a distance of 1 millimeter or less. In some embodiments at least a portion of plurality of second source terminals 230*a* . . . 230*g* are electrically coupled to second die pad 225 with a plurality of second source wirebonds 240*a* . . . 240*g* such that the second die pad forms an external switch node connection, as illustrated in greater detail below.

This configuration may enable relatively short second source wirebonds 240*a* . . . 240*g* such that an electrical connection from second die pad 225 to plurality of second source terminals 230*a* . . . 230*g* may exhibit low inductance, low parasitic capacitance and low loss characteristics. In some embodiments one or more plurality of signal I/O terminals 231*a* . . . 231*d* are coupled to one or more signal I/O connections 295*a* . . . 295*d* accessible on outside of electronic package 200. In some embodiments it may be advantageous to have signal I/O connections 295*a* . . . 295*d* on the same side of high side transistor 115 as second source terminals 230*a* . . . 230*g* so signal I/O terminals may be easily routed to external connections that are separated from other external connections at a different voltage potential.

In further embodiments plurality of first drain terminals 215*a* . . . 215*f* on top surface 207 of low side transistor 110 are electrically coupled to second die pad 225 with a plurality of first drain wirebonds 245*a* . . . 245*f*. A plurality of second drain wirebonds 247*a* . . . 247*h* may be electrically coupled between second train terminals 235*a* . . . 235*h* and an input voltage (Vin) pad 253.

In some embodiments one or more level shift circuit terminals 250 on top surface 207 of low side transistor 110 are electrically coupled to one or more level shift receiver terminals 255 on top surface 227 of high side transistor 115 with one or more die to die level shift wirebonds 260. In some embodiments one or more die-die level shift wirebonds 260 may enable relatively low parasitic capacitance to ground from the level shift connections and relatively low parasitic inductance as compared to connections that may be formed outside of electronic package 200. In some embodiments one or more level shift receiver terminals 255 may be coupled to a signal modulator that is coupled to a gate drive circuit (such as high side transistor driver 170 illustrated in FIG. 1) for high side transistor 115. In further embodiments one or more level shift wirebonds 260 may use a bond stitch on ball type of attachment to increase the wirebond wire height.

In some embodiments one or more low side communication terminals 251 on top surface 207 of low side transistor

110 are electrically coupled to one or more high side communication terminals 256 on top surface 227 of high side transistor 115 with one or more die to die communication wirebonds 261. In some embodiments one or more die-die communication wirebonds 261 may enable relatively low parasitic capacitance to ground as compared to connections that may be formed outside of electronic package 200. In some embodiments one or more communication terminals 251, 256 and wirebonds 261 may enable the integration of circuits such as, but not limited to, a startup circuit, a voltage reference circuit and a current source circuit on low side transistor 110. In further embodiments one or more die to die communication wirebonds 261 may use a bond stitch on ball type of attachment to increase the wirebond wire height. Although a particular number of terminals and wirebonds are illustrated in FIG. 2A it is understood that any number of terminals and wirebonds may be used.

In some embodiments, electronic package 200 may have additional signal I/O terminals used to communicate with circuits outside of the electronic package. For example, low side transistor 110 may have one or more signal I/O terminals 280*a* . . . 280*d* and 280*e* . . . 280*i* that may be connected to signal I/O connections 285*a* . . . 285*d* and 285*e* . . . 285*i*, respectively.

In some embodiments, low side transistor 110 and high side transistor 115 may be arranged within electronic package 200 so primary power connections and internal power flow may be positioned substantially in an "L" shape shown by dashed lines 263. More specifically, in some embodiments first die pad 205 (i.e., the ground connection) may form a first leg 265 of the "L" shape, second die pad 225 (i.e., the switch node connection) may form a corner 270 of the "L" shape and Vin pad 253 (i.e., the Vin connection) may form a second leg 275 of the "L" shape. First leg 265 may be oriented orthogonal to second leg 275 resulting in a relatively compact electronic package 200. Further, the "L" shape configuration may also enable a relative large number of low side signal I/O connections 285*a* . . . 285*d* and 285*e* . . . 285*i* for communication to external control circuits. More specifically, electronic package 200 may enable a central first die pad 205 (i.e., ground connection) with a plurality of individual signal I/O connections 285*a* . . . 285*d*, 285e . . . 285*i* arranged on both sides of the ground connection. In one embodiment signal I/O connections 285*a* . . . 285*d*, 285e . . . 285*i* may be metallic pads comprising a portion of package base 203. In some embodiments one or more of individual signal I/O connections 285*a* . . . 285*d*, 285*e* . . . 285*i* may be ground referenced signals and may be used for level shift, separate source kelvin, gate return, PWM, VDD, programming for dv/dt control, current sense, current limit, fault signal, sleep and/or other connections.

Figure 2B:
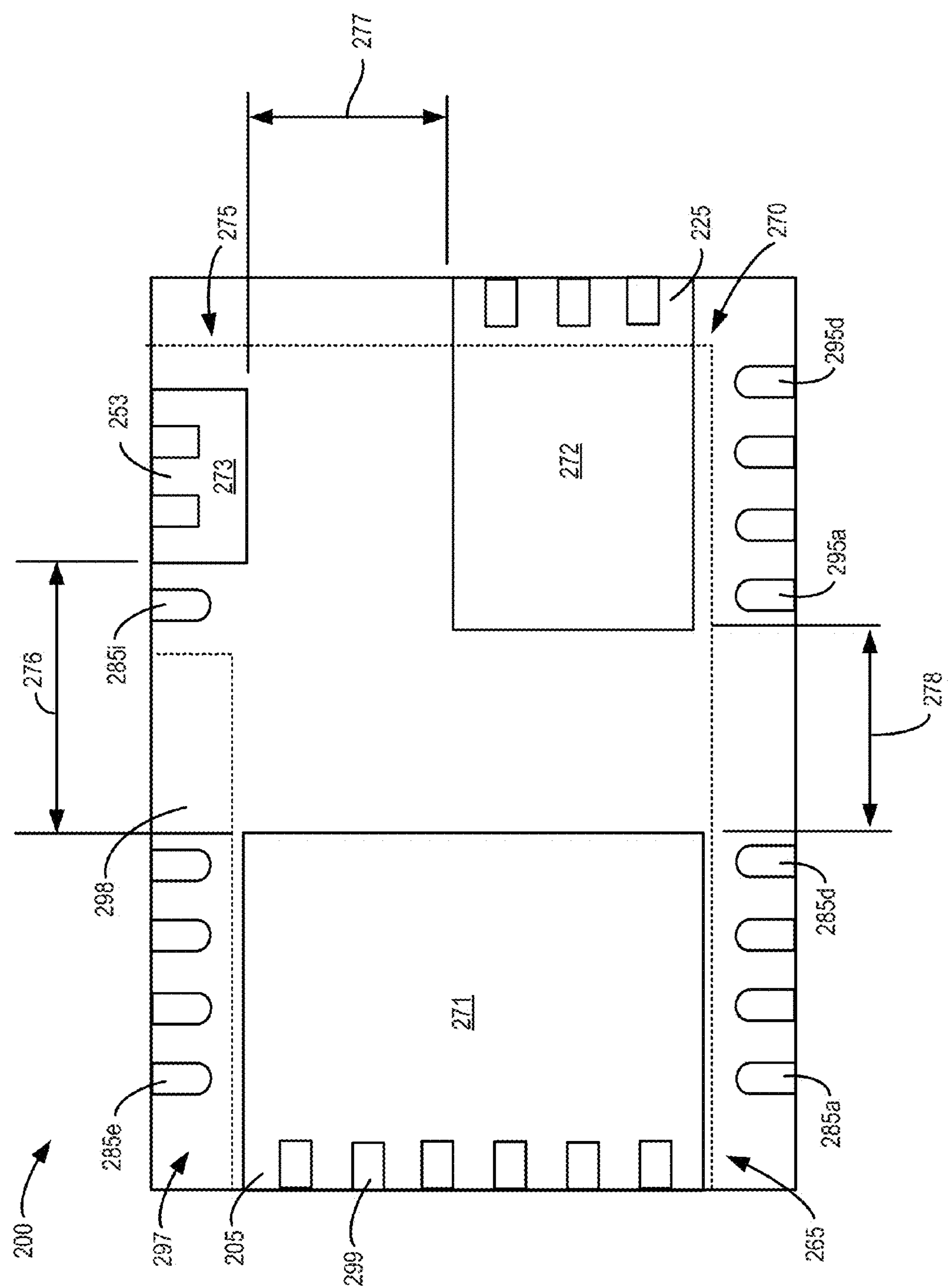
FIG. 2B is a plan view of the bottom of the half-bridge component illustrated in FIG. 2A.

Now referring to FIG. 2B a view of a bottom surface 297 of electronic package 200 is illustrated. As discussed in more detail herein, in some embodiments electronic package 200 may be fabricated using a quad-flat no lead (QFN) manufacturing process having a plurality of external connections that may be soldered to a circuit board, as discussed in more detail below. In one embodiment electronic package 200 may have external dimensions of 6 millimeters by 8 millimeters and may have a pin pitch of 0.65 millimeters, however other embodiments may have different dimensions. In some embodiments electronic package 200 has an external ground connection 271 formed by first die pad 205, an external switch node connection 272 formed by second die pad 225 and an external Vin connection 273 formed by Vin pad 253 that are all disposed on bottom surface 297 of electronic package 200. Electronic package may also have one or more signal I/O connections 285*a* . . . 285*d*, 285*e* . . . 285*i* and 295*a* . . . 295*d* disposed on bottom surface 297. Encapsulant 298 may be disposed in-between the external connections as illustrated in greater detail below.

In further embodiments some of the plurality of external connections such as ground connection 271, switch node connection 272 and Vin connection 273 may each have one or more indentation features 299 that are filled in with encapsulant 298. More specifically, in one embodiment indentation feature 299 may be a location where the entire thickness of package base 203 is removed and filled with encapsulant 298. In further embodiments indentation feature 299 may be a region where only a portion of the thickness of the package base is removed (e.g., a half-etch feature in a leadframe) and filled with encapsulant 298 such that the entire top surface of the package base pad is available for wirebonds or other uses.

In some embodiments ground connection 271, switch node connection 272 and Vin connection 273 may be arranged in an "L" shaped pattern with the ground connection forming a first leg 265, the switch node connection forming a corner 270 and the Vin connection forming a second leg 275. This pattern may also enable the connection of a high voltage D.C. Bus directly to low side transistor 110 and may also enable the connection of a high side D.C. power supply pin (e.g., Vb) to both high side transistor 110 and low side transistor 115.

In some embodiments electronic package 200 may be configured for use in high voltage applications where a leakage path along the surface of encapsulant 298 may be configured to meet reliability and performance requirements. More specifically, dirt, pollution, salt, and particularly water on the surface of a high voltage insulator can create a conductive path across it, causing leakage currents flashovers between pads of different voltage potentials. The embodiment illustrated FIG. 2B has a first creepage distance of 276 between ground connection 271 and switch node connection 272, a second creepage distance of 277 between switch node connection 272 and Vin connection 273 and a third creepage distance of 278 between the Vin connection and the ground connection. In one embodiment the first, second and third creepage distances, 276, 277 and 278, respectively, are between 0.8 millimeters and 3 millimeters, while in another embodiment they are between 1.8 millimeters and 2.8 millimeters, and in one embodiment they are at least 1.5 millimeters.

Figure 2C:
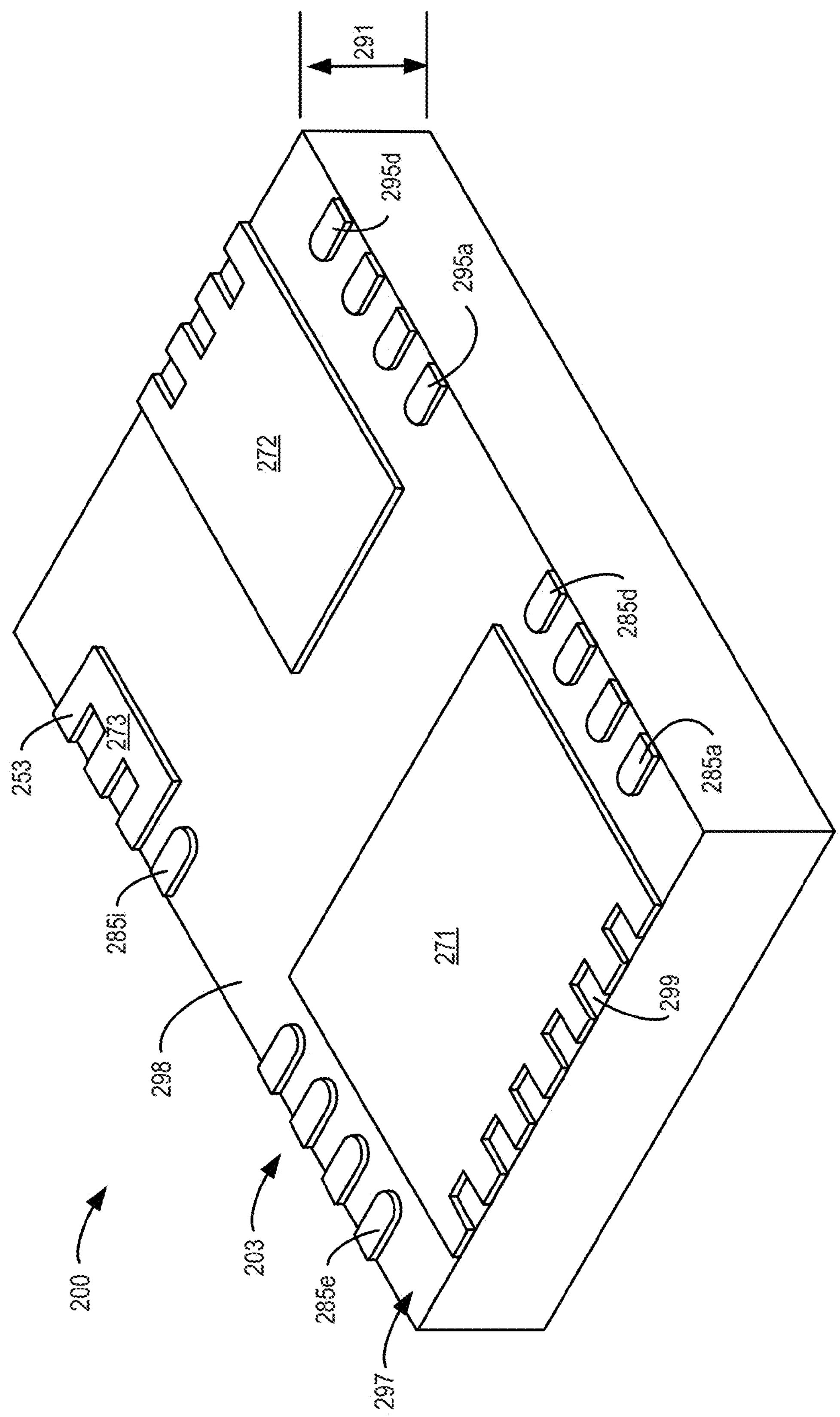
FIG. 2C is an isometric view of the bottom of the half-bridge component illustrated in FIG. 2A.

Now referring to FIG. 2C, an isometric view of bottom surface 297 of electronic package 200 is shown. Encapsulant 298 may define a thickness 291 of electronic package 200 that may be between 0.5 millimeters to 1.5 millimeters, while in another embodiment the thickness is between 0.7 millimeters and 1.2 millimeters, and in one embodiment the thickness is at least 0.8 millimeters. As discussed above, in the embodiment illustrated in FIG. 2C, package base 203 may comprise a metallic leadframe that is shown extending out of bottom surface 297 of electronic package 200, however in other embodiments the package base may be substantially coplanar with encapsulant 298.

In some embodiments, low side transistor 110 (see FIGS. 1-2A) and high side transistor 115 may be GaN-based enhancement-mode field effect transistors. In other embodiments low side transistor 110 and high side transistor 115 may be any other types of devices including, but not limited to, GaN-based depletion-mode transistors, GaN-based depletion-mode transistors connected in series with silicon based enhancement-mode field-effect transistors having the gate of the depletion-mode transistor connected to the source of the silicon-based enhancement-mode transistor, silicon carbide based transistors or silicon-based transistors.

In some embodiments low side transistor 110 and high side transistor 115 may be made from a GaN-based material. In one embodiment the GaN-based material may include a layer of GaN on a layer of silicon. In further embodiments the GaN based material may include, but not limited to, a layer of GaN on a layer of silicon carbide, sapphire or aluminum nitride. In one embodiment the GaN based layer may include, but not limited to, a composite stack of other III nitrides such as aluminum nitride and indium nitride and III nitride alloys such as A1GaN and InGaN.

In further embodiments one or more of low and high side transistor 110, 115, respectively may operate at voltage levels in the range of 650 Volts and may have a specific resistance between 1 and 10 milliohm-$cm^2$ in some embodiments and in other embodiments between 2 and 5 milliohm-$cm^2$.

In some embodiments, various levels of additional copackaging and/or integration may be implemented within electronic package 200. For example, in one embodiment control circuit 105 (see FIG. 1) may be attached to first die pad 205 (se FIG. 2A) and coupled to one or more dies within electronic package and one or more signal I/O's. In another example low side drive circuit 160 (see FIG. 1) may be monolithically integrated on a single die with low side transistor 110, and similarly high side drive circuit 170 may be monolithically integrated with high side transistor 115. In another embodiments low and high side drive circuits 160, 170, respectively may be separate die that are copackaged with low side transistor and high side transistor, 110, 115, respectively. In further examples controller 105 may be monolithically integrated on a single die with low side drive circuit 160 and low side transistor 110. Other variations of copackaging and integration are within the scope of this disclosure. In further examples one or more passive devices may be integrated within electronic package 200. In one embodiment a boot strap capacitor is integrated within electronic package 200. Further embodiments of electronic package 200 may contain any number of active or passive circuit elements arranged in any configuration, as discussed in more detail below.

As discussed above, in some embodiments package base 203 (see FIG. 2B) may comprise a leadframe which may include copper while in other embodiments other types of metals may be used, including metal alloys. In further embodiments the leadframe may be a part of a larger leadframe that may be subsequently singulated into multiple electronic packages 200, as discussed in more detail below. In one embodiment the leadframe may be between 50 microns and 250 microns thick. In further embodiments leadframe 205 may be between 100 and 200 microns thick while in another embodiment it may be approximately 150 microns thick. In other embodiments package base 203 may be a printed circuit board as known by those of skill in the art and may have one or more layers of circuit routing.

In some embodiments encapsulant 298 may be a dielectric polymer-based material and may have one or more solid fillers such as, but not limited to silica, aluminum-oxide or aluminum nitride. In further embodiments the polymer may be a thermosetting epoxy, polyimide or polyurethane. In other embodiments the polymer may be a thermoplastic material such as, but not limited to polyphenylene sulfide or liquid crystal polymer.

Figure 3:
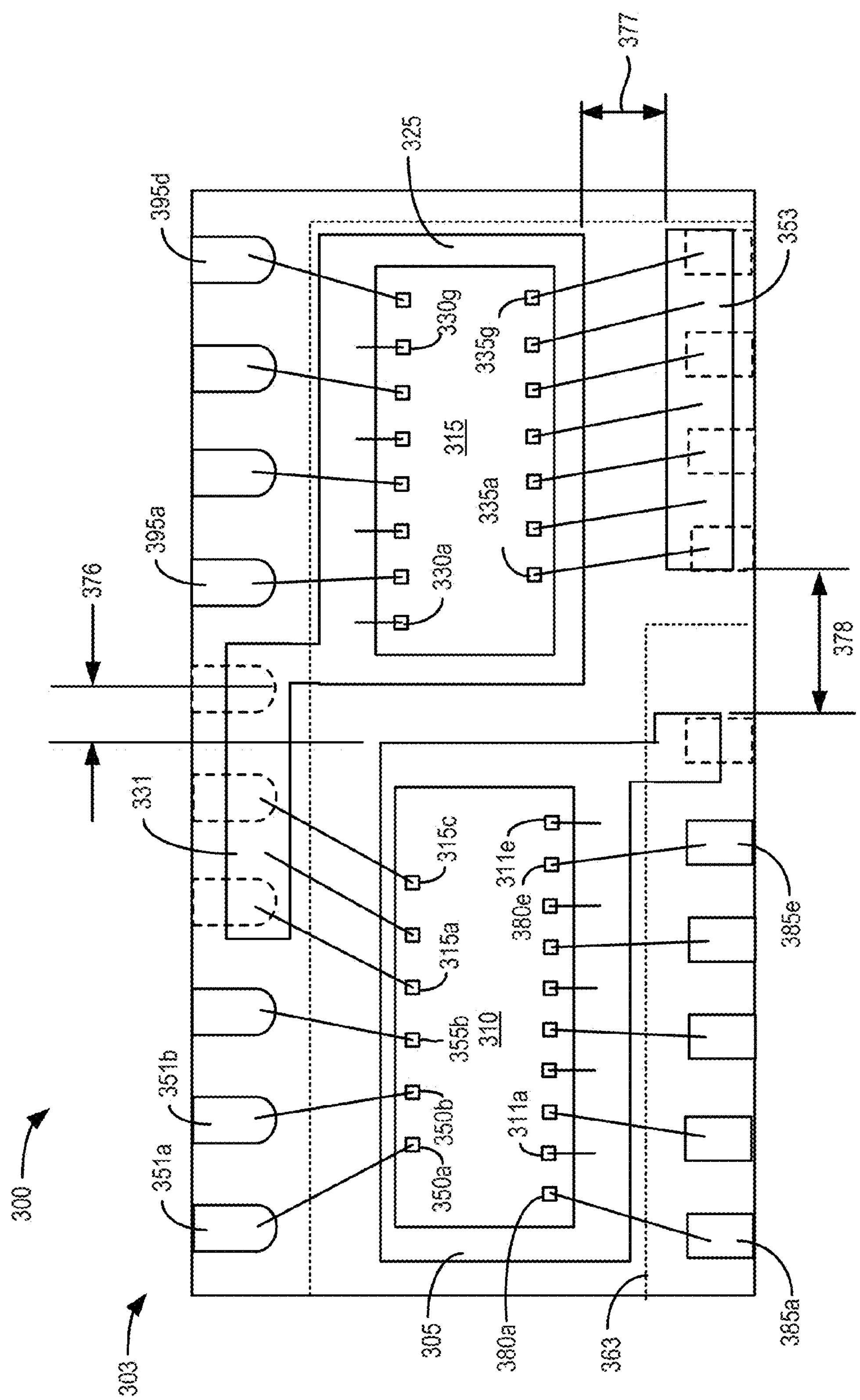
FIG. 3 is a plan view of the inside of a half-bridge component with the encapsulant removed according to an embodiment of the invention.

Now referring to FIG. 3, a plan view of the interior of another embodiment of a multi-die electronic package 300 is illustrated. Similar to FIG. 2A, the package encapsulant has been removed for clarity. Electronic package 300 contains low side transistor 310 and high side transistor 315 similar to circuit 100 illustrated in FIG. 1. In some embodiments electronic package 300 may be fabricated using a QFN manufacturing process where low side and high side transistors, 310, 315, respectively are attached to a package base 303 comprising a metal leadframe or a printed circuit board.

In some embodiments low side transistor 310 is mounted to a first die pad 305 comprising a portion of package base 303. Low side transistor 310 includes a plurality of first source terminals 311*a* . . . 311*e* and a plurality of first drain terminals 315*a* . . . 315*c* that may be separated by a distance of 1 millimeter or less. Plurality of first source terminals 311*a* . . . 311*e* are electrically coupled to first die pad 305 with a plurality of wirebonds such that the first die pad forms an external ground connection that may exhibit low inductance, low parasitic capacitance and low loss characteristics.

High side transistor 315 is mounted to a second die pad 325 comprising a portion of package base 303. High side transistor 315 includes a plurality of second source terminals 330*a* . . . 330*g* and a plurality of second drain terminals 335*a* . . . 335*g* that may be separated by a distance of 1 millimeter or less. In some embodiments at least a portion of plurality of second source terminals 330*a* . . . 330*g* are electrically coupled with a plurality of wirebonds to a fused pin pad 331 that is coupled to second die pad 325 with a package base 303 connection such that the second die pad forms an external switch node connection that may exhibit low inductance, low parasitic capacitance and low loss characteristics. In some embodiments one or more plurality of second source terminals 330*a* . . . 330*g* are coupled to one or more signal I/O connections 395*a* . . . 395*d* accessible on outside of electronic package 300.

In some embodiments plurality of first drain terminals 315*a* . . . 315*c* are electrically coupled to second die pad 325 with a plurality of wirebonds. In further embodiments a plurality wirebonds may be electrically coupled between second train terminals 335*a* . . . 235*g* and an input voltage (Vin) pad 353.

In some embodiments one or more level shift circuit terminals 350*a*, 350*b* on low side transistor 310 are electrically coupled to one or more level shift connections 351*a*, 351*b* that may be coupled to high side transistor 315 with one or more connections made outside of electronic package 300. Although a particular number of terminals and wirebonds are illustrated in FIG. 3 it is understood that any number of terminals and wirebonds may be used.

In some embodiments, electronic package 300 may have additional signal I/O terminals used to communicate with circuits outside of the electronic package. For example, low side transistor 310 may have one or more signal I/O terminals 380*a* . . . 380*e* that may be connected to signal I/O connections 385*a* . . . 385*e*, respectively.

In some embodiments, low side transistor 310 and high side transistor 315 may be arranged within electronic package 300 so primary power connections and internal power flow may be positioned substantially in an "L" shape shown by dashed lines 363. More specifically, in some embodiments first die pad 305 (i.e., the ground connection) may form a first leg of the "L" shape, second die pad 325 (i.e., the switch node connection) may form a corner of the "L" shape and Vin pad 353 (i.e., the Vin connection) may form a second leg of the "L" shape.

In some embodiments electronic package 300 may be configured for use in high voltage applications where a leakage path along the surface of encapsulant 398 may be configured to meet reliability and performance requirements. The embodiment illustrated FIG. 3 has a first creepage distance of 376 between ground and switch node, a second creepage distance of 377 between switch node and Vin and a third creepage distance of 378 between the Vin and the ground. In one embodiment the first, second and third creepage distances, 376, 377 and 378, respectively, are between 0.6 millimeters and 2 millimeters, while in another embodiment they are between 0.8 millimeters and 1.2 millimeters, and in one embodiment they are at least 1.0 millimeters.

Figure 4:
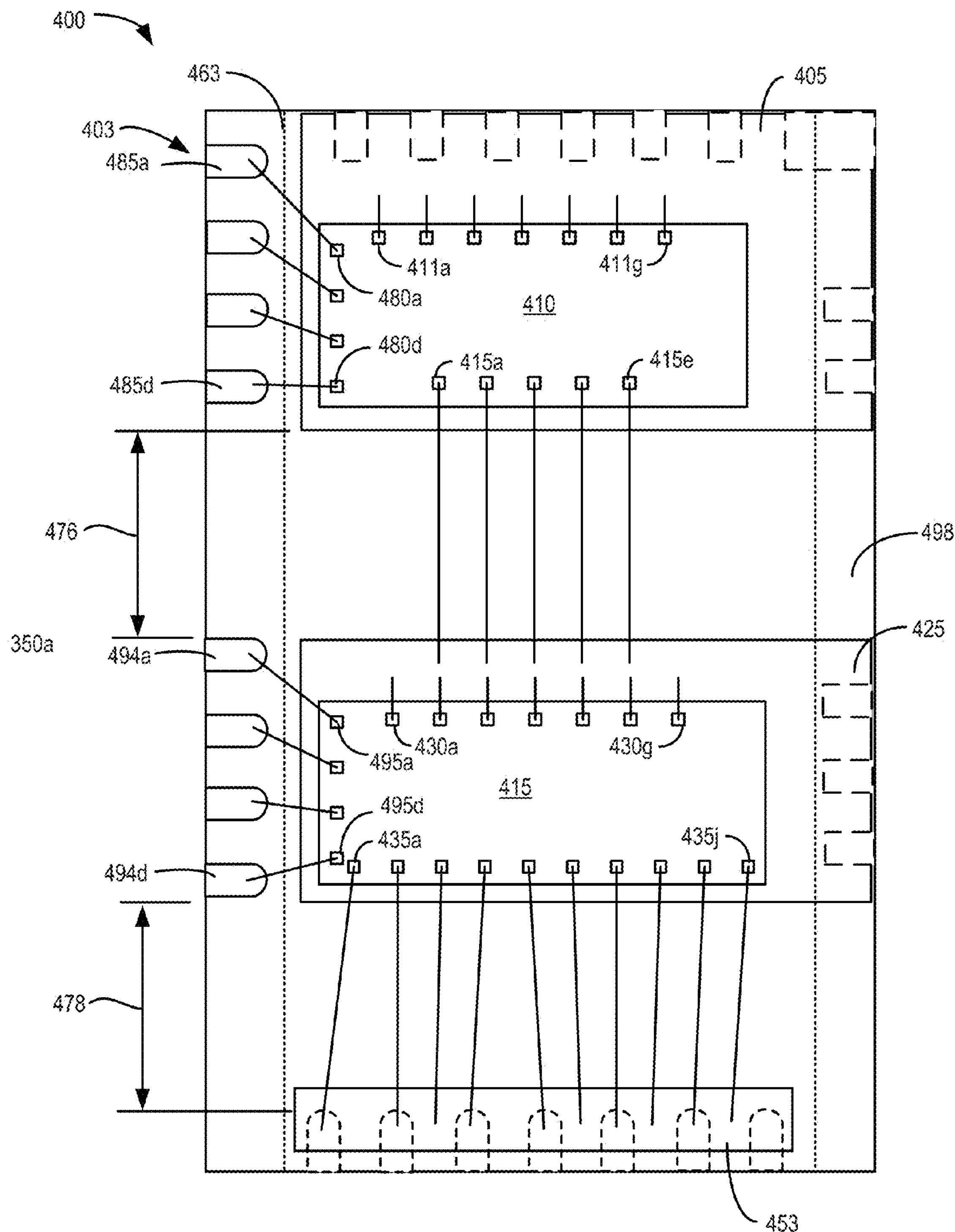
FIG. 4 is a plan view of the inside of a half-bridge component with the encapsulant removed according to an embodiment of the invention.

Now referring to FIG. 4, a plan view of the interior of another embodiment of a multi-die electronic package 400 is illustrated. Similar to FIG. 2A, the package encapsulant has been removed for clarity. Electronic package 400 contains low side transistor 410 and high side transistor 415 similar to circuit 100 illustrated in FIG. 1. In some embodiments electronic package 400 may be fabricated using a QFN manufacturing process where low side and high side transistors, 410, 415, respectively are attached to a package base 403 comprising a metal leadframe or a printed circuit board.

In some embodiments low side transistor 410 is mounted to a first die pad 405 comprising a portion of package base 403. Low side transistor 410 includes a plurality of first source terminals 411*a* . . . 411*g* and a plurality of first drain terminals 415*a* . . . 415*e* that may be separated by a distance of 1 millimeter or less. Plurality of first source terminals 411*a* . . . 411*g* are electrically coupled to first die pad 405 with a plurality of wirebonds such that the first die pad forms an external ground connection that may exhibit low inductance, low parasitic capacitance and low loss characteristics.

High side transistor 415 is mounted to a second die pad 425 comprising a portion of package base 403. High side transistor 415 includes a plurality of second source terminals 430*a* . . . 430*g* and a plurality of second drain terminals 435*a* . . . 435*j* that may be separated by a distance of 1 millimeter or less. In some embodiments at least a portion of plurality of second source terminals 430*a* . . . 430*g* are electrically coupled with a plurality of wirebonds to second die pad 425 such that the second die pad forms an external switch node connection that may exhibit low inductance, low parasitic capacitance and low loss characteristics. High side transistor 415 may have one or more signal I/O connections 495*a* . . . 495*d* accessible on outside of electronic package 400 via terminals 494*a* . . . 494d and/or accessible within electronic package for die to die interconnects.

In further embodiments plurality of first drain terminals 415*a* . . . 415*e* are electrically coupled to second die pad 425 with a plurality of wirebonds. In further embodiments a plurality wirebonds may be electrically coupled between second train terminals 435*a* . . . 435*j* and an input voltage (Vin) pad 453.

In some embodiments, electronic package 400 may have additional signal I/O terminals used to communicate with circuits outside of the electronic package. For example, low side transistor 410 may have one or more signal I/O terminals 480*a* . . . 480*d* that may be connected to signal I/O connections 485*a* . . . 485*d*, respectively and may be used for level shift and/or other connections. Although a particular number of terminals and wirebonds are illustrated in FIG. 4 it is understood that any number of terminals and wirebonds may be used.

In some embodiments, low side transistor 410 and high side transistor 415 may be arranged within electronic package 400 so primary power connections and internal power flow may be positioned substantially in an linear shape shown by dashed lines 463. More specifically, in some embodiments first die pad 405 (i.e., the ground connection) may form a first portion of the linear shape, second die pad 425 (i.e., the switch node connection) may form a central portion of the linear shape and Vin pad 453 (i.e., the Vin connection) may form a last portion of the linear shape.

In some embodiments electronic package 400 may be configured for use in high voltage applications where a leakage path along the surface of encapsulant 498 may be configured to meet reliability and performance requirements. The embodiment illustrated FIG. 4 has a first creepage distance of 476 between ground and switch node and a second creepage distance of 478 between the Vin and the ground. In one embodiment the first and second creepage distances, 476 and 478, respectively, are between 0.8 millimeters and 3 millimeters, while in another embodiment they are between 1.8 millimeters and 2.8 millimeters, and in one embodiment they are at least 2.0 millimeters.

Figure 5A:
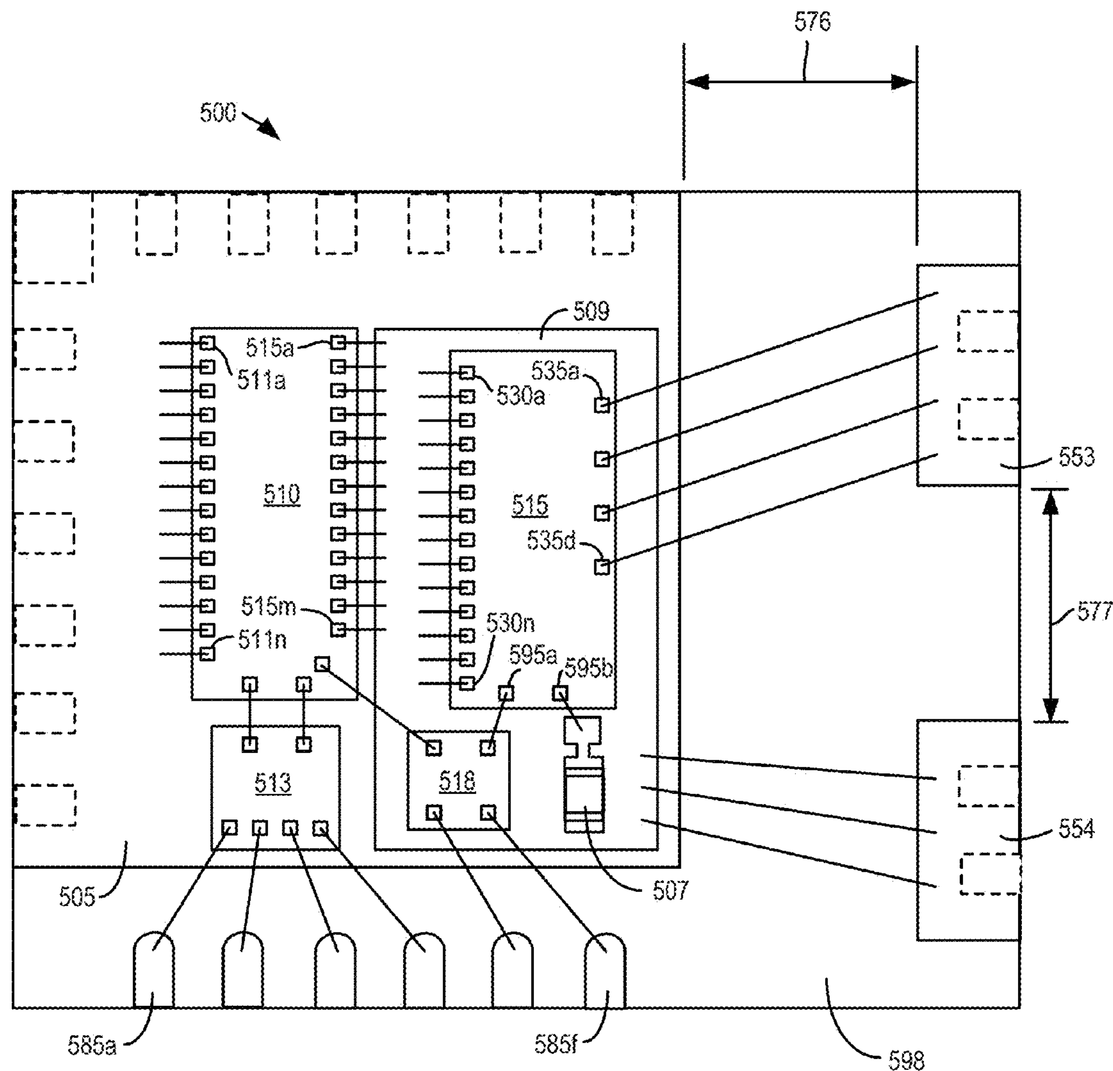
FIG. 5A is a plan view of the inside of a half-bridge component with the encapsulant removed according to an embodiment of the invention.
Figure 5B:
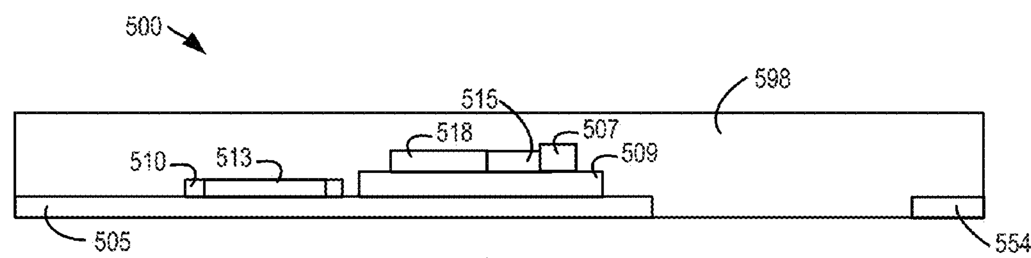
FIG. 5B is a cross-sectional view of the inside of a the half-bridge component illustrated in FIG. 5A according to an embodiment of the invention.

Now referring to FIG. 5A, a plan view of the interior of another embodiment of a multi-die electronic package 500 is illustrated. Similar to FIG. 2A, the package encapsulant has been removed for clarity. Electronic package 500 contains low side transistor 510, a low side transistor driver 513, a high side transistor 515 and a high side transistor driver 518 similar to circuit 100 illustrated in FIG. 1. Electronic package 500 may also contain one or more passive components 507. In some embodiments electronic package 500 may be fabricated using a modified QFN manufacturing process that includes an insulated and patterned substrate 509, as discussed in more detail below. FIG. 5B shows a simplified cross-section of package 500 and will be referred to simultaneously.

In some embodiments low side transistor 510 and substrate 509 are mounted to a first die pad 505 comprising a portion of package base 503. Low side transistor 510 includes a plurality of first source terminals 511*a* . . . 511*n* and a plurality of first drain terminals 515*a* . . . 515*m* that may be separated by a distance of 1 millimeter or less. Plurality of first source terminals 511*a* . . . 511*n* are electrically coupled to first die pad 505 with a plurality of wirebonds such that the first die pad forms an external ground connection that may exhibit low inductance, low parasitic capacitance and low loss characteristics.

High side transistor 515 is mounted to an electrically conductive top surface of substrate 509. High side transistor 515 includes a plurality of second source terminals 530*a* . . . 530*n* and a plurality of second drain terminals 535*a* . . . 535*d* that may be separated by a distance of 1 millimeter or less. In some embodiments at least a portion of plurality of second source terminals 530*a* . . . 530*n* are electrically coupled with a plurality of wirebonds to electrically conductive top surface of substrate 509 such that the electrically conductive top surface forms an internal switch node connection. High side transistor 515 may have one or more signal I/O connections 595*a*, 595*b* coupled to high side driver 518 and/or bootstrap capacitor 507. In some embodiments an electrically conductive top surface of substrate may be a patterned metallization layer that allows the attachment of one or more passive components and may electrically route or provide wirebond pads for integration with the rest of the circuit.

In further embodiments plurality of first drain terminals 515*a* . . . 515*m* are electrically coupled to electrically conductive top surface of substrate 509 with a plurality of wirebonds. A plurality wirebonds may be electrically coupled between second train terminals 535*a* . . . 535*d* and an input voltage (Vin) pad 553. In further embodiments a plurality of wirebonds may be electrically coupled between electrically conductive top surface of substrate 509 and switch node pad 554. In some embodiments, electronic package 500 may have additional signal I/O terminals 585*a* . . . 585*f* used to communicate with circuits outside of the electronic package.

In some embodiments electronic package 500 may be configured for use in high voltage applications where a leakage path along the surface of encapsulant 598 may be configured to meet reliability and performance requirements. In some embodiments, substrate 509 may be made of a high dielectric material such as, but not limited to a ceramic or an organic material. In one embodiment substrate 509 may be made from aluminum oxide and have metallization on a top and a bottom surface. A high dielectric material such as aluminum oxide may be used to achieve the required dielectric withstanding voltage between the switch node and ground while keeping substrate 509 relatively thin.

In further embodiments substrate 509 may be made of a relatively high thermal conductivity material such as, but not limited to aluminum nitride, or silicon nitride and may provide an efficient thermal path from high side transistor 515 to first die pad 505 and out to a larger circuit board. The embodiment illustrated FIG. 5 has a first creepage distance of 576 between ground and switch node/Vin and a second creepage distance of 577 between switch node and Vin. In one embodiment the first and second creepage distances, 576 and 577, respectively, are between 1 millimeters and 4 millimeters, while in another embodiment they are between 2.5 millimeters and 3.1 millimeters, and in one embodiment they are at least 2.8 millimeters.

In some embodiments electronic package 500 may have external dimensions of 5 millimeters by 6 millimeters while in other embodiments it may have external dimensions of 6 millimeters by 8 millimeters and a 0.65 millimeter pin pitch. In another embodiment electronic package 500 may have external dimensions of 8 millimeters by 8 millimeters with high and low side transistors having areas of up to 28 $mm^2$ delivering 20 amps of D.C. current with a power dissipation in the range of 12 watts.

Figure 6:
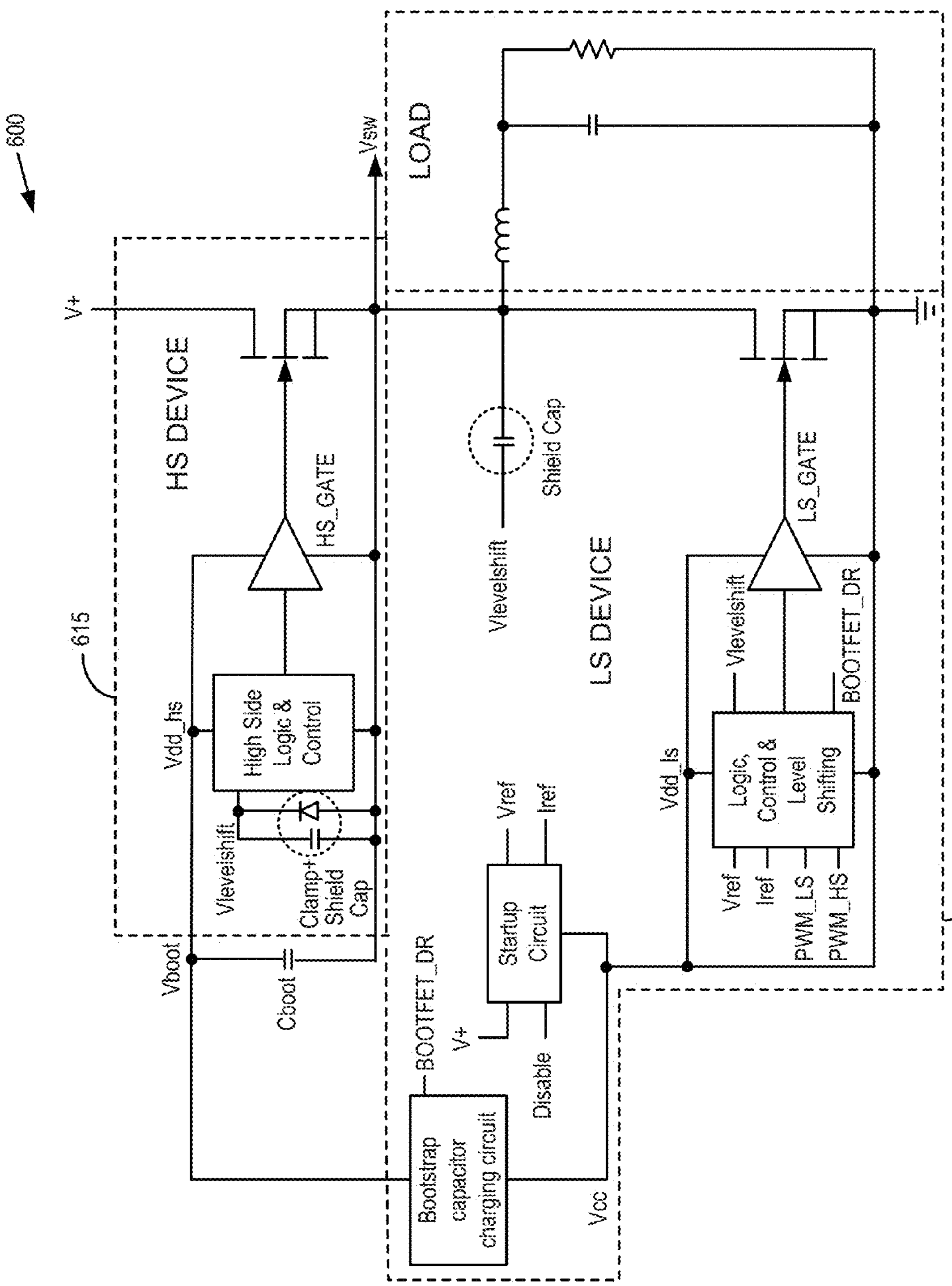
FIG. 6 is a simplified schematic of a half bridge power conversion circuit according to an embodiment of the invention.

Now referring to FIG. 6 an alternative schematic is illustrated that may be employed with one or more electronic packages disclosed herein. In this embodiment low side device 610 and high side device 615 both include additional active and passive circuitry, and may be incorporated into one or more electronic packages. Circuit 600 along with other circuits that may be employed within one or more electronic packages disclosed herein are disclosed in U.S. patent application Ser. No. 14/667,319 entitled Half Bridge Power Conversion Circuits Using GaN Devices which is incorporated herein in its entirety for all purposes.

Single Die Packages

Figure 7A:
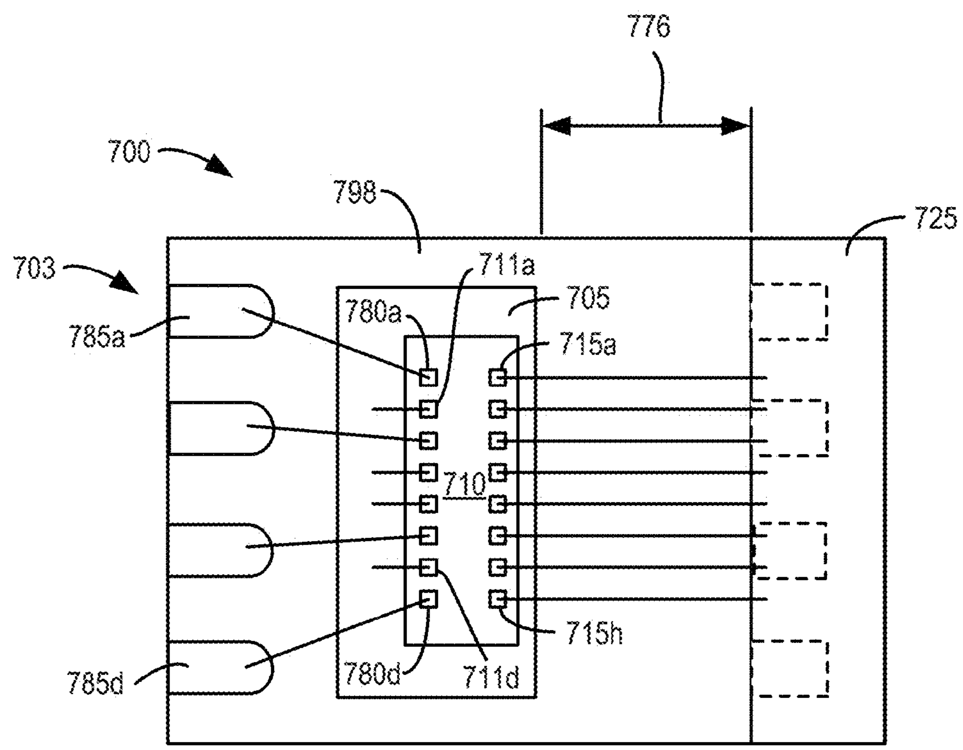
FIG. 7A is a plan view of the inside of an electronic component with the encapsulant removed according to an embodiment of the invention.

Now referring to FIG. 7A, a plan view of the interior of an embodiment of a single die electronic package 700 is illustrated. Similar to FIG. 2A, the package encapsulant has been removed for clarity. Electronic package 700 may be configured to contain either a low side or a high side transistor die. In this example a low side transistor 710 will be illustrated similar to circuit 100 illustrated in FIG. 1, however it is understood that this embodiment is not limited to a low side transistor and may be used for a high side transistor or a die having a higher degree of integrated functionality as described above. In some embodiments electronic package 700 may be fabricated using a QFN manufacturing process where low side transistor 710 is attached to a package base 703 comprising a metal leadframe or a printed circuit board.

In some embodiments low side transistor 710 is mounted to a first die pad 705 comprising a portion of package base 703. Low side transistor 710 includes a plurality of first source terminals 711*a* . . . 711*d* and a plurality of first drain terminals 715*a* . . . 715*h* that may be separated by a distance of 1 millimeter or less. Plurality of first source terminals 711*a* . . . 711*d* are electrically coupled to first die pad 705 with a plurality of relatively short wirebonds such that the first die pad forms an external ground connection that may exhibit low inductance, low parasitic capacitance and low loss characteristics. In further embodiments plurality of first drain terminals 715*a* . . . 715*h* are electrically coupled to drain pad 725 with a plurality of wirebonds.

In some embodiments, electronic package 700 may have additional signal I/O terminals used to communicate with circuits outside of the electronic package. For example, low side transistor 710 may have one or more signal I/O terminals 780*a* . . . 780*d* that may be connected to signal I/O connections 785*a* . . . 785*d*, respectively and may be used for level shift, separate source kelvin, gate return, PWM, VDD, programming for dv/dt control, current sense, current limit, fault signal, sleep and/or other connections. Although a particular number of terminals and wirebonds are illustrated in FIG. 7 it is understood that any number of terminals and wirebonds may be used.

In some embodiments electronic package 700 may be configured for use in high voltage applications where a leakage path along the surface of encapsulant 798 may be configured to meet reliability and performance requirements. The embodiment illustrated FIG. 7 has a first creepage distance of 776 between first pad 705 (i.e., ground) and drain pad 725. In one embodiment first creepage distance 776 is between 1.1 millimeters and 3.1 millimeters, while in another embodiment it is between 1.6 millimeters and 2.6 millimeters, and in one embodiment it is between 2.0 and 2.2 millimeters. In further embodiments electronic package 700 may have outer dimensions of 5 millimeters by 6 millimeters and a pin pitch of 1.27 millimeters, however other embodiments may have different package dimensions.

Figure 7B:
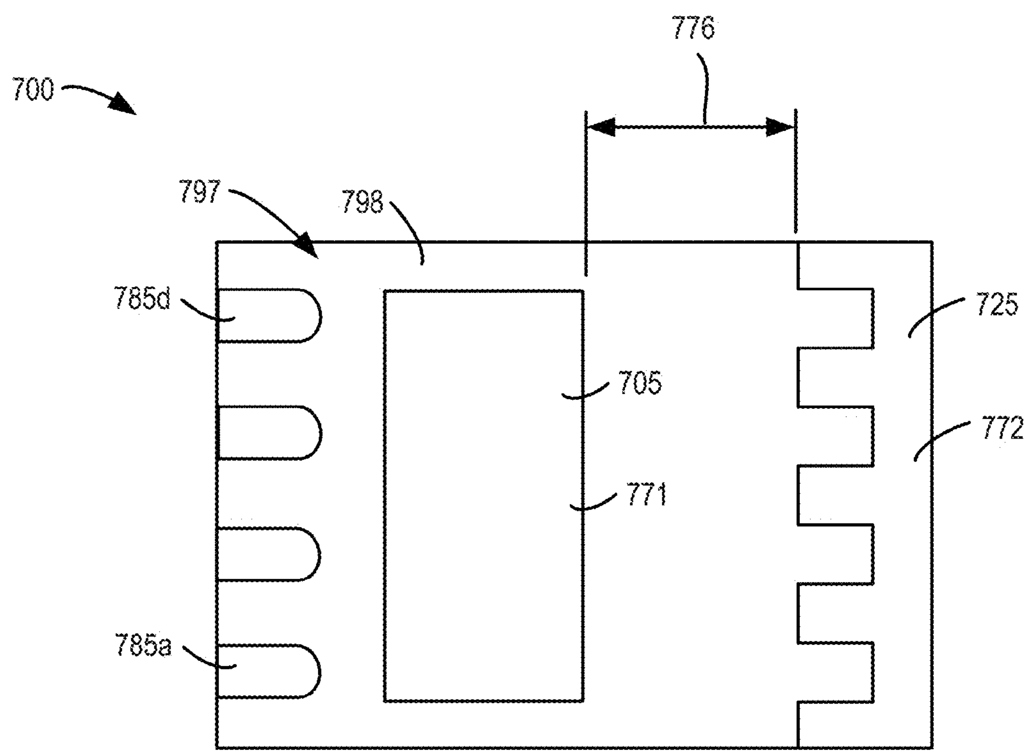
FIG. 7B is a plan view of the bottom of the electronic component illustrated in FIG. 7A.

Now referring to FIG. 7B a bottom surface 797 of electronic package 700 is illustrated. As discussed in more detail herein, in some embodiments electronic package 700 may be fabricated using a QFN manufacturing process having a plurality of external connections that may be soldered to a circuit board. In some embodiments electronic package 700 has an external ground connection 771 formed by first die pad 705 and an external switch node connection 772 formed by second die pad 725. Electronic package may also have one or more signal I/O connections 785*a* . . . 785*d* disposed on bottom surface 797. Encapsulant 798 may be disposed in-between the external connections and first creepage distance 776 is disposed between ground connection 771 and switch node connection 772.

In an alternative embodiment first die pad 705 may be used to mount a controller die and signal I/O connections 785*a* . . . 785*d* can be used to communicate with the controller die.

Figure 8:
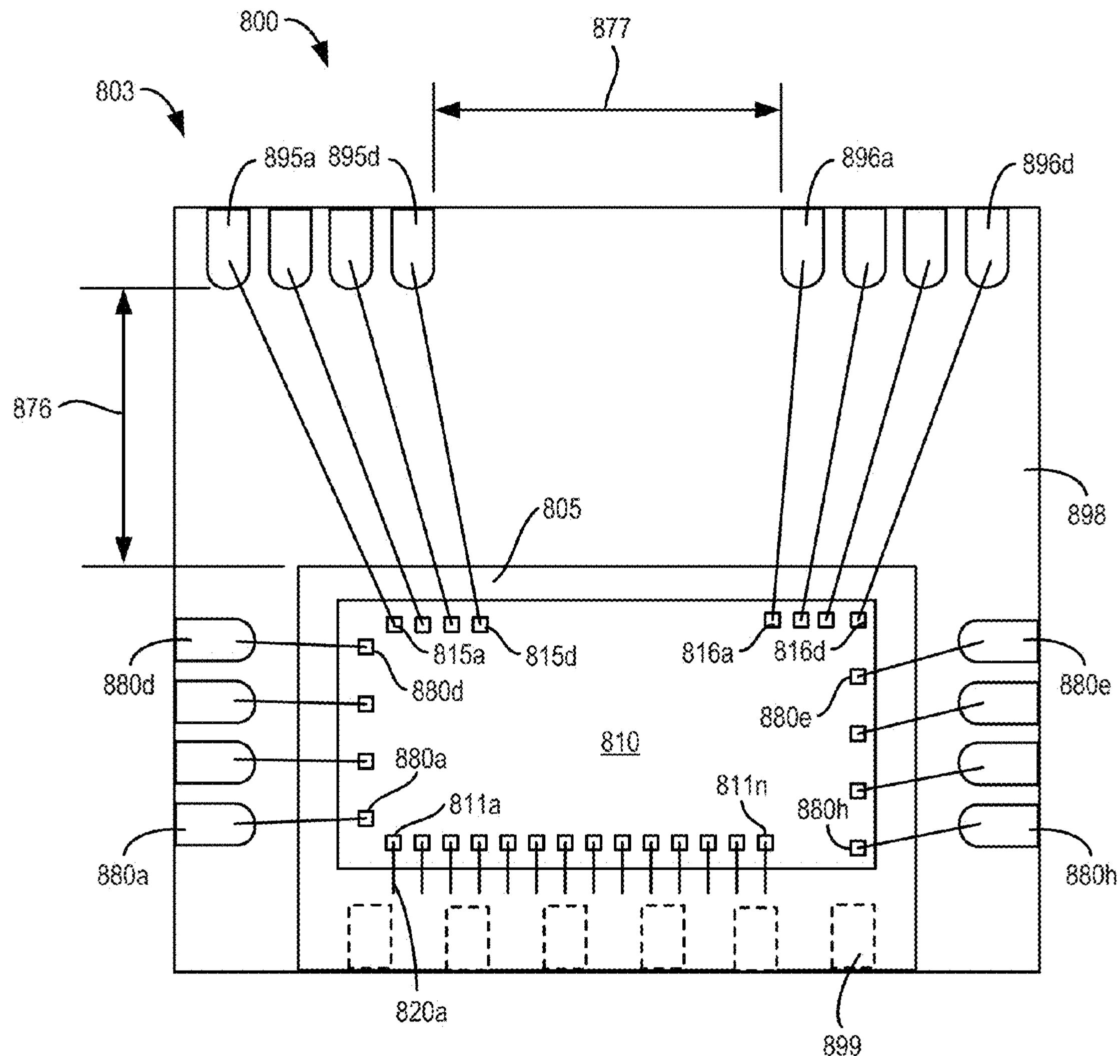
FIG. 8 is a plan view of the inside of an electronic component with the encapsulant removed according to an embodiment of the invention.

Now referring to FIG. 8, a plan view of the interior of an embodiment of a single die electronic package 800 is illustrated. Similar to FIG. 2A, the package encapsulant has been removed for clarity. Electronic package 800 may be configured to contain a bidirectional transistor. In some embodiments electronic package 800 may be fabricated using a QFN manufacturing process where a bidirectional transistor 810 is attached to a package base 803 comprising a metal leadframe or a printed circuit board.

In some embodiments bidirectional transistor 810 is mounted to a first die pad 805 comprising a portion of package base 803. Bidirectional transistor 810 includes a plurality of common source terminals 811*a* . . . 811*n* and a plurality of first drain terminals 815*a* . . . 815*d* and a plurality of second drain terminals 816*a*-816*d*. In some embodiments plurality of common source terminals 811*a* . . . 811*n* may be separated from plurality of first drain terminals 815*a* . . . 815*d* and a plurality of second drain terminals 816*a*-816*d* by a distance of 1 millimeter or less. First die pad 805 may have one or more indentation features 899.

Plurality of common source terminals 811*a* . . . 811*n* are electrically coupled to first die pad 805 with a plurality of relatively short wirebonds 820a such that the first die pad forms an external connection that may exhibit low inductance, low parasitic capacitance and low loss characteristics. In further embodiments plurality of first drain terminals 815*a* . . . 815*d* are electrically coupled to plurality of first drain pads 295*a* . . . 295*d* with a plurality of wirebonds. Similarly, plurality of second drain terminals 816*a* . . . 816*d* are electrically coupled to plurality of second drain pads 296*a* . . . 296*d* with a plurality of wirebonds.

In some embodiments, electronic package 700 may have additional signal I/O terminals used to communicate with circuits outside of the electronic package. For example, bidirectional transistor 810 may have one or more signal I/O terminals 880*a* . . . 880*d* and 880*e* . . . 880*h* that may be connected to signal I/O connections 885*a* . . . 785*d* and 880*e* . . . 880*h*, respectively and may be used for kelvin source or other pin assignment options such as, but not limited to Vdd, PWM and logic level inputs or outputs. Although a particular number of terminals and wirebonds are illustrated in FIG. 8 it is understood that any number of terminals and wirebonds may be used.

In some embodiments electronic package 800 may be configured for use in high voltage applications where a leakage path along the surface of encapsulant 898 may be configured to meet reliability and performance requirements. The embodiment illustrated FIG. 8 has a first creepage distance of 876 between first pad 805 (i.e., common source) and plurality of first and second drain pad pads 295*a* . . . 295*d*, 296*a* . . . 296*d*, respectively. Electronic package 800 may also have a second creepage distance of 877 between plurality of first drain pad pads 295*a* . . . 295*d* and plurality of second drain pads 296*a* . . . 296*d*.

In one embodiment first and second creepage distances 876, 877, respectively are between 1.1 millimeters and 3.1 millimeters, while in another embodiment the are between 1.6 millimeters and 2.6 millimeters, and in one embodiment they are between 2.0 and 2.2 millimeters. In further embodiments electronic package 800 may have outer dimensions of 6 millimeters by 7 millimeters and a pin pitch of 0.65 millimeters, however other embodiments may have different package dimensions.

Example QFN Manufacturing Process

Figure 9:
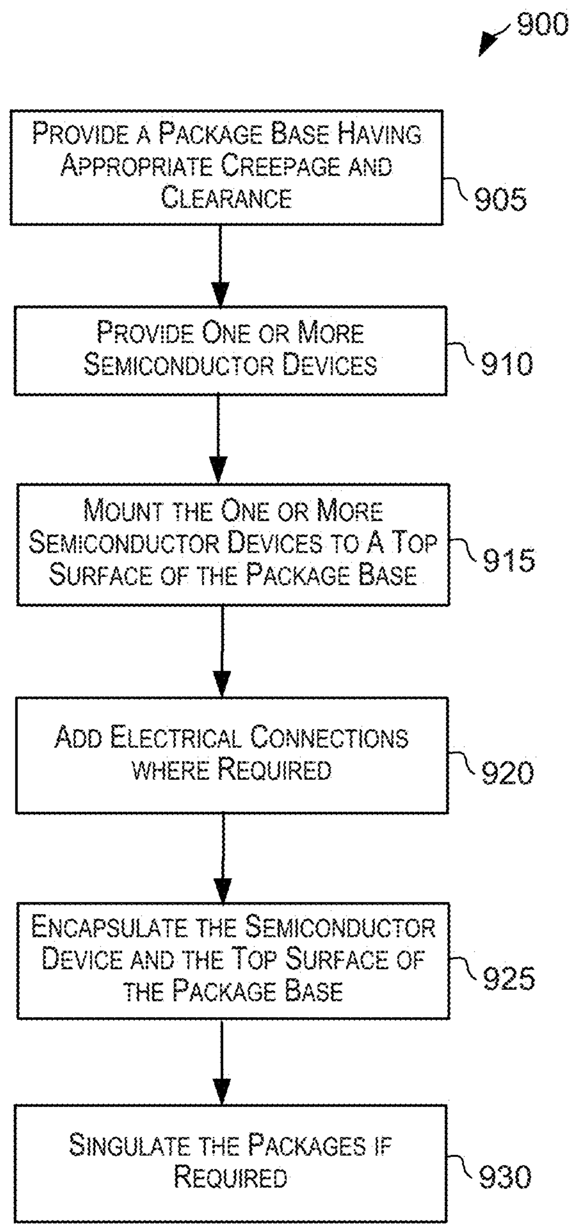
FIG. 9 is method of manufacturing an electronic component according to an embodiment of the invention.

Now referring to FIG. 9 an example QFN manufacturing process 900 is illustrated. Manufacturing process 900 is for example only and other electronic package manufacturing processes may be used without departing from the invention.

In one embodiment the QFN manufacturing process may include a substrate that may comprise electrically conductive portions is used to form a package base on which one or more semiconductor dies are mounted and electrically coupled to. Portions of the substrate may form one or more external electrical connections and a dielectric encapsulant may be formed on at least a top surface of the substrate and around the one or more semiconductor dies, as discussed in more detail below.

Now referring to step 905 of FIG. 9 a package base having appropriate creepage and clearance is provided. In some embodiments package base may be a metallic leadframe. In some embodiments the leadframe may comprise copper while in other embodiments other types of metals may be used, including alloys. In other embodiments the package base may be a printed circuit board having one or more layers of electrical routing. In further embodiments the leadframe or printed circuit board may be a part of a larger panel that may be subsequently singulated into multiple singular electronic packages. In one embodiment the package base may be between 50 microns and 1 millimeter thick. In further embodiments the package base may be between 100 microns 750 microns thick while in another embodiment it may be between 150 microns and 500 microns thick.

In some embodiments the package base is equipped with the appropriate creepage and clearance distances between pads of different voltage potentials as required by the application. In some embodiments the creepage and clearance distances may be between 0.5 millimeter and 4 millimeters while in further embodiments they may be between 1 millimeters and 3 millimeters and in further embodiments may be between 2 and 3 millimeters.

Now referring to step 910 of FIG. 9 one or more semiconductor devices are provided. As discussed above, in some embodiments the one or more semiconductor devices may be GaN-based devices. In further embodiments the one or more semiconductor devices may have a plurality of source pads separated by a plurality of drain pad by 1 millimeter or less.

Now referring to step 915 of FIG. 9 the one or more semiconductor devices are mounted to top surface the package base. In some embodiments the one or more semiconductor devices may have a metalized back surface that is soldered to the package base while in other embodiments they may be glued with an adhesive that may or may not be electrically conductive.

Now referring to step 920 of FIG. 9 electrical connections may be added to electrically couple the one or more semiconductor devices to the package base and/or to each other. In one embodiment wirebonds may be used that comprise gold, silver, copper or aluminum. In another embodiment other interconnect methods may be used such as metallic clips and other electrically conductive substances.

Now referring to step 925 in FIG. 9 the one or more semiconductor devices and at least a top surface of the package base are encapsulated with an encapsulant material. The encapsulant material has a thickness that extends from top surface of the package base to a top surface of the semiconductor package such that the active areas of the semiconductor device and the electrical interconnects may be protected from the environment. In some embodiments the encapsulant material may extend into recesses or indentation features in the package base creating a substantially solid electronic package with few or no air voids. In some embodiments more than one semiconductor package that may be known as a "panel" may be encapsulated at the same time.

In some embodiments the encapsulant material may be a dielectric polymer-based material and may have one or more solid fillers such as, but not limited to silica, aluminum-oxide or aluminum nitride. In further embodiments the polymer may be a thermosetting epoxy, polyimide or polyurethane. In other embodiments the polymer may be a thermoplastic material such as, but not limited to polyphenylene sulfide or liquid crystal polymer. In some embodiments encapsulant material may be disposed on the package base with a transfer molding process.

Now referring to step 930 in FIG. 9 if more than one electronic package is fabricated in a panel format the packages are singulated. In some embodiments they may be sawn apart while in other embodiments they may be punch singulated and in further embodiments they may be laser cut.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. An integrated half-bridge component comprising:

a first semiconductor die mounted to a first die pad and including a first power transistor having a first source terminal and a first drain terminal, wherein the first source terminal is electrically coupled to the first die pad;

a second semiconductor die mounted to a second die pad and including a second power transistor having a second source terminal and a second drain terminal, wherein the second source terminal is electrically coupled to the second die pad;

an electrically insulative encapsulant formed around the first and the second semiconductor dies; and wherein the integrated half-bridge component has an external ground connection formed by the first die pad, an external switch node connection formed by the second die pad and an external $V_{in}$ connection that is coupled to a drain of the second semiconductor die.

2. The integrated half-bridge component of claim 1 further comprising a gap having a distance of at least 1.5 mm disposed between the first die pad and the second die pad.

3. The integrated half-bridge component of claim 1 wherein the first and the second semiconductor dies are GaN-based.

4. The integrated half-bridge component of claim 1 wherein the first semiconductor die has a top surface including the first source and the first drain terminal and a bottom surface that is attached to the first die pad.

5. The integrated half-bridge component of claim 1 wherein the first drain terminal is electrically coupled to the second die pad.

6. The integrated half-bridge component of claim 5 further comprising power connections disposed on a bottom surface of the integrated half-bridge component including a ground connection, a switch node connection and a $V_{in}$ connection.

7. The integrated half-bridge component of claim 6 wherein the power connections are arranged in an "L" shaped pattern with the ground connection forming a first leg, the switch node connection forming a corner and the $V_{in}$ connection forming a second leg.

8. The integrated half-bridge component of claim 6 wherein the power connections are arranged in a linear pattern wherein the ground connection is followed by the switch node connection that is followed by the $V_{in}$ connection.

9. The integrated half-bridge component of claim 1 wherein the first semiconductor die includes a first level shift circuit that is electrically coupled to a level shift receiver terminal on the second semiconductor die.

10. The integrated half-bridge component of claim 9 wherein the level shift receiver terminal is coupled to a signal modulator that is coupled to a second power transistor drive circuit.

11. The integrated half-bridge component of claim 9 wherein the first level shift circuit is coupled to a gate drive terminal on the second semiconductor die using a die to die wirebond.

12. The integrated half-bridge component of claim 11 wherein the die to die wirebond is formed using a bond stitch on ball attachment.

13. An electronic power conversion component comprising:

an electrically conductive package base comprising a plurality of leads and first and second die pads;

a first GaN-based die having a top surface opposite a bottom surface, wherein the bottom surface is attached to the first die pad and wherein the top surface includes a first power transistor having a first source terminal and a first drain terminal, wherein the first source terminal is electrically coupled to the first die pad;

a second GaN-based die having a top surface opposite a bottom surface, wherein the bottom surface is attached to the second die pad and wherein the top surface includes a second power transistor having a second source terminal and a second drain terminal, wherein the second source terminal is electrically coupled to the second die pad;

one or more conductors electrically coupling at least one of the plurality of leads to the first GaN-based die; and an encapsulant formed over the first and second GaN-based dies and at least a top surface of the electrically conductive package base.

14. The electronic power conversion component of claim 13 further comprising a third die including a control circuit electrically coupled to the first GaN-based die, and attached to the first die pad.

15. An electronic component comprising:

a first lead, a second lead and a third lead;

a first GaN-based semiconductor die having a bottom surface opposite a top surface, wherein the bottom surface is mounted to the first lead and the top surface includes a first power transistor having a first source terminal, a first drain terminal and a first input terminal, and wherein the first source terminal is electrically coupled to the first lead, the first drain terminal is coupled to the second lead and the first input terminal is coupled to the third lead.

16. The electronic component of claim 15 wherein a plurality of wirebonds electrically couple the first source terminal to the first lead.

17. The electronic component of claim 15 wherein the electronic package has a fourth lead that is a kelvin connection to the first source terminal.

18. An electronic power conversion component comprising:

an electrically conductive package base comprising a plurality of leads and a die pad;

a first GaN-based die secured to the die pad and including a first power transistor having a first source terminal and a first drain terminal, wherein the first source terminal is electrically coupled to the die pad;

an insulative substrate secured to the die pad and having an electrically conductive top surface;

a second GaN-based die secured to the electrically conductive top surface and including a second power transistor having a second source terminal and a second drain terminal, wherein the second source terminal is electrically coupled to the electrically conductive top surface;

a switch-node connection formed within the electronic power conversion component between the first drain terminal and the electrically conductive top surface; and an encapsulant formed over the first and second GaN-based dies, the insulative substrate and at least a top surface of the electrically conductive package base.

19. The electronic power conversion component of claim 18 further comprising a third die secured to the die pad and including control circuitry configured to control the operation of the first and the second power transistors.

20. The electronic power conversion component of claim 18 further comprising a bootstrap capacitor disposed within the power conversion component and attached to the electrically conductive top surface of the insulative substrate.

* * * * *